United States Patent [19]

Botez et al.

[11] Patent Number: 4,985,897
[45] Date of Patent: Jan. 15, 1991

[54] SEMICONDUCTOR LASER ARRAY HAVING HIGH POWER AND HIGH BEAM QUALITY

[75] Inventors: Dan Botez, Redondo Beach; Michael Jansen, Los Angeles; Luke J. Mawst, Torrance; Gary L. Peterson, Long Beach; William W. Simmons, Rancho Palos Verdes; Jaroslava Z. Wilcox, Los Angeles; Jane J. J. Yang, Los Angeles, all of Calif.

[73] Assignee: TRW Inc., Redondo Beach, Calif.

[21] Appl. No.: 254,905

[22] Filed: Oct. 7, 1988

[51] Int. Cl.⁵ .................................................. H01S 3/19
[52] U.S. Cl. ........................................ 372/50; 372/18; 372/23; 372/45; 372/48; 372/97; 372/102; 372/103
[58] Field of Search ...................... 372/50, 43, 44, 97, 372/23, 96, 102, 103, 18, 45, 48

[56] References Cited

U.S. PATENT DOCUMENTS

| | | | |
|---|---|---|---|
| 4,641,311 | 2/1987 | Ackley | 372/18 |
| 4,661,962 | 4/1987 | Clayton | 372/50 |
| 4,694,459 | 9/1987 | Burnham et al. | 372/45 |
| 4,723,252 | 2/1988 | Botez et al. | 372/48 |
| 4,764,935 | 8/1988 | Wilcox et al. | 372/50 |

FOREIGN PATENT DOCUMENTS

| | | | |
|---|---|---|---|
| 0178765 | 4/1986 | European Pat. Off. | 372/50 |
| 0015879 | 1/1987 | Japan | 372/50 |

OTHER PUBLICATIONS

A. A. Golubentsev et al., "Theory of Phase Locking of an Array of Lasers" Sov. Phys. JETP 66(4), pp. 676-682, Oct. 1987.
D. Botez et al., "Diffraction-Limited, High-Power Fundamental-Mode Operation from Diode-Laser Phase-Locked Arrays of Closely Spaced Antiguides," Conf. on Lasers & Electro-Optics, pp. 477-478, Apr. 1988.
D. Botez et al., "High-Power, Diffraction-Limited-Beam Operation from Phase-Locked Arrays of Closely Spaced 'Leaky' Waveguides (Antiguides)," Appl. Phys. Lett. 53(6), pp. 464-466, Aug. 8, 1988.
James R. Leger et al., "Real-Time Depth Measurement and Display Using Fresnel Diffraction and White-Light Processing," Appl. Optics, vol. 23, No. 10, pp. 1655-1657, May 15, 1984.
James R. Leger et al., "Coherent Addition of AlGaAs Lasers Using Microlenses and Diffractive Coupling," Appl. Phys. Lett. 52(21), pp. 1171-1173, May 25, 1988.

*Primary Examiner*—Georgia Epps
*Attorney, Agent, or Firm*—Noel F. Heal; Sol L. Goldstein

[57] ABSTRACT

A semiconductor laser array with features providing good beam quality at high powers, first by employing a laterally unguided diffraction region in which light from a set of waveguides is re-imaged in accordance with the Talbot effect and two arrays of waveguides may be used to provide a spatial filtering effect to select a desired array mode. This provides a laser array with increased power per unit solid angle, and with additional advantages of ability to scale the device up to larger arrays, ability to control the electrical excitation of the device for better optimization, and improved modal discrimination. A second aspect of the invention is the use of a resonance condition in an antiguide array, to produce a uniform near-field intensity pattern and improved coupling and device coherence. This resonance structure may be combined with the Talbot-effect structure to suppress the out-of-phase mode, or the out-of-phase mode may be suppressed by other means, such as by introducing interelement radiation losses or absorption losses in the antiguide array.

22 Claims, 4 Drawing Sheets

FIG. 3
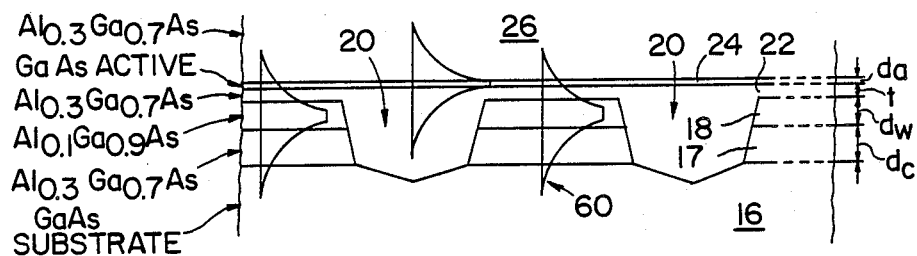
FIG. 4
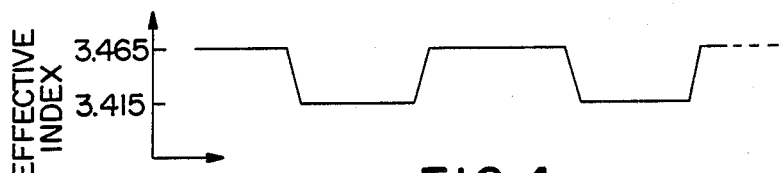
FIG. 5
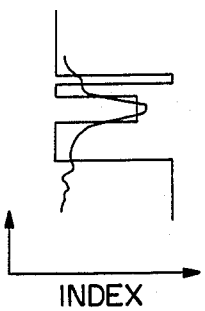
FIG. 6
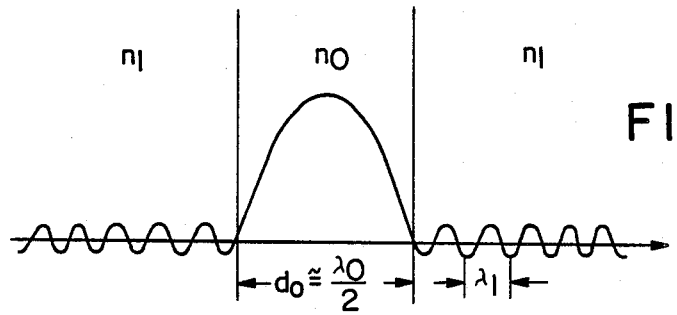
FIG. 7a
FIG. 7b
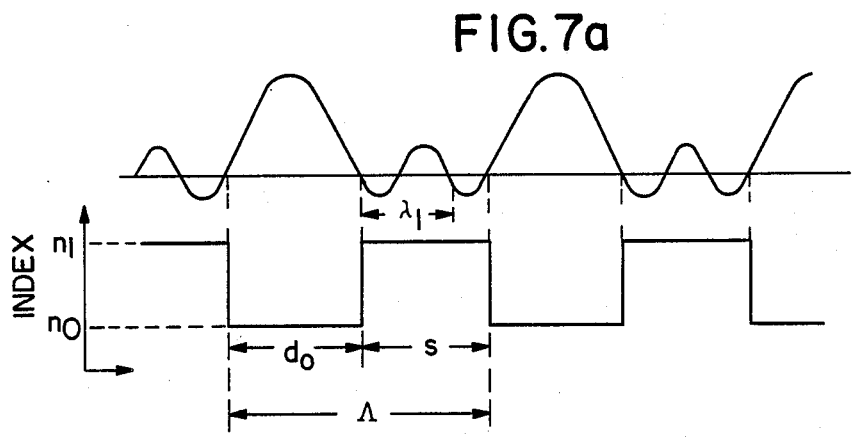

FIG. 10
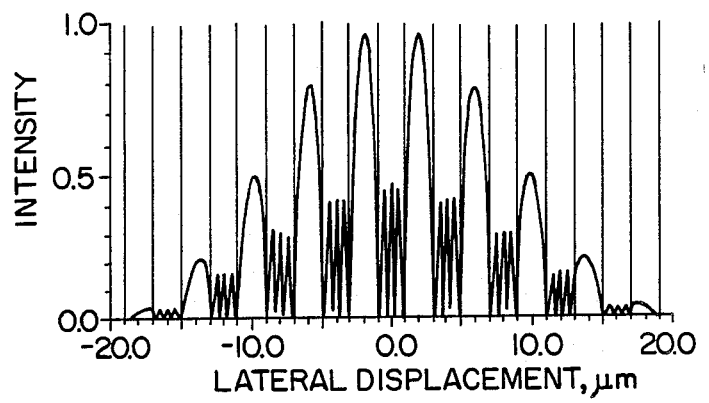
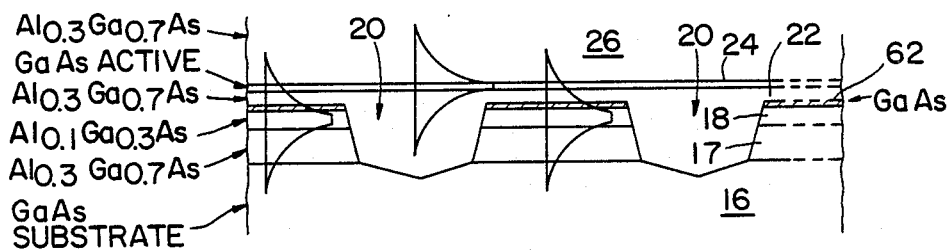
FIG. 11
FIG. 12

SEMICONDUCTOR LASER ARRAY HAVING HIGH POWER AND HIGH BEAM QUALITY

CROSS-REFERENCE TO RELATED APPLICATIONS

This is related to the subject matter of the following two applications:

(1) Ser. No. 06/921,648 filed Oct. 21, 1986 by Dan Botez, entitled "Laser Array with Wide-Wave-guide Coupling Region," now issued as U.S. Pat. No. 4,852,113.

(2) Ser. No. 07/180,415 filed Apr. 12, 1988 by Dan Botez et al., entitled "Phase-Locked Array of Semiconductor Lasers Using Closely Spaced Antiguides," now issued as U.S. Pat. No. 4,860,298.

BACKGROUND OF THE INVENTION

This invention relates generally to semiconductor diode lasers and, more particularly, to one-dimensional arrays of semiconductor diode lasers fabricated as monolithic structures. Single-element diode lasers are limited in power to outputs of the order of 30 milliwatts (mW), but arrays of diode lasers can be designed to provide output powers of hundreds of milliwatts. Such high power outputs are useful in optical communications systems, laser printers and other applications.

A survey of the state of the art of phaselocked laser arrays can be found in a paper entitled "Phase-Locked Arrays of Semiconductor Diode Lasers," by Dan Botez and Donald Ackley, IEEE Circuits and Devices Magazine, Vol. 2, No. 1, pp. 8–17, January 1986.

By way of general background, a semiconductor diode laser is a multilayered structure composed of different types of semiconductor materials, chemically doped with impurities to give them either an excess of electrons (n type) or an excess of electron vacancies or holes (p type). The basic structure of the semiconductor laser is that of a diode, having an n type layer, a p type layer, and an undoped active layer sandwiched between them. When the diode is forwardbiased in normal operation, electrons and holes recombine in the region of the active layer, and light is emitted. The layers on each side of the active layer usually have a lower index of refraction than the active layer, and function as cladding layers in a dielectric waveguide that confines the light in a direction perpendicular to the layers. Various techniques are usually employed to confine the light in a lateral direction as well, and crystal facets are located at opposite ends of the structure, to provide for repeated reflections of the light back and forth in a longitudinal direction in the structure. If the diode current is above a threshold value, lasing takes place and light is emitted from one of the facets, in a direction generally perpendicular to the emitting facet.

Various approaches have been used to confine the light in a lateral sense within a semiconductor laser, i.e. perpendicular to the direction of the emitted light and within the plane of the active layer. If a narrow electrical contact is employed to supply current to the device, the lasing action will be limited to a correspondingly narrow region, in a process generally referred to as "gain guiding." At high powers, gain-guided devices have strong instabilities and produce highly astigmatic, double-peaked beams. For most high-power semiconductor laser applications there is also a requirement for a diffraction-limited beam, i.e. one whose spatial spread is limited only by the diffraction of light, to a value roughly proportional to the wavelength of the emitted light divided by the width of the emitting source. Because of the requirement for a stable diffraction-limited beam, most research in the area has been directed to index-guided lasers. In these, various geometries are employed to introduce dielectric waveguide structures for confining the laser light in a lateral sense, i.e. perpendicular to the direction of light emission and generally in the same plane as the active layer.

Most semiconductor structures employed for lateral index guiding in laser arrays are known as positive-index guides, i.e. the refractive index is highest in regions aligned with the laser elements and falls to a lower value in regions between elements, thereby effectively trapping light within the laser elements. Another type of index guiding is referred to as negative-index guiding, or antiguiding, wherein the refractive index is lowest in the regions aligned with the laser elements and rises to a higher value between elements. Some of the light encountering the higher refractive index material will leak out of the lasing element regions; hence the term leaky-mode laser array is sometimes applied.

In general, an array of laser emitters can oscillate in one or more of multiple possible configurations, known as array modes. In what is usually considered to be the most desirable array mode, all of the emitters oscillate in phase. This is known as the fundamental or 0°-phase-shift array mode, and it produces a far-field pattern in which most of the energy is concentrated in a single lobe, the width of which is limited, ideally, only by the diffraction of light. When adjacent laser emitters are 180° out of phase, the array operates in the 180°-phase-shift array mode, or out-of-phase array mode, and produces two relatively widely spaced lobes in the far-field distribution pattern. Multiple additional modes exist between these two extremes, depending on the phase alignment of the separate emitters, and in general there are N possible array modes for an N-element array. Many laser arrays operate in two or three array modes simultaneously and produce one or more beams that are typically two or three times wider than the diffraction limit.

The present invention addresses two closely related problems pertaining to the operation of laser arrays at high powers and with high beam quality. The first problem involves the continuing search for a laser array structure of higher brightness (power per unit angle), operating in a selected array mode and without sacrificing efficiency and compactness. One aspect of the present invention addresses this need and provides a high-power output laser array operating in either the fundamental (in-phase) array mode or the out-of-phase array mode.

The second major problem area pertains to the degree of coherence and uniformity of output intensities that can be obtained across a laser array. Prior to the invention, coupling between lasers was limited to "nearest-neighbor" coupling to only adjacent lasers. This provided only a limited degree of overall coherence, and a characteristic cosine-shaped near-field intensity distribution. As outlined in the following summary, one aspect of the present invention provides a semiconductor laser array with a high degree of device coherence and a practically uniform near-field intensity distribution from a laser array.

SUMMARY OF THE INVENTION

The present invention has two closely related aspects pertaining to the general problem of providing laser array structures of high power and high beam quality. In accordance with one aspect of the invention, a semiconductor laser array structure includes two arrays of parallel waveguides separated by a laterally unguided diffraction region. The diffraction region has a length approximately equal to a multiple of one half of a distance known as the Talbot length. In the preferred embodiment of the invention, the diffraction region has a length equal to an odd multiple of half the Talbot length and the two arrays of waveguides are selectively aligned with each other in a lateral sense, and operate as a spatial filter to eliminate unwanted array modes from the output of the structure. In one form of this embodiment, the two arrays are offset from each other laterally by one half of the periodic element spacing, such that the active laser elements of one array are aligned with interelement regions of the other array. This configuration favors operation in the fundamental array mode and effectively eliminates the out-of-phase mode from the device output. In another embodiment, the active lasing elements of each array are in approximate alignment and this favors operation in the out-of-phase array mode only.

The diffraction region length may also be made an even multiple of half Talbot lengths, such as one full Talbot length, with the device further including means for suppressing the out-of-phase array mode.

The structure as described thus far could employ two separately fabricated arrays separated by the laterally unguided diffraction region. Preferably, however, the entire structure is monolithic. That is to say, the diffraction region is a semiconductor structure integrated with the semiconductor arrays. Although manufactured as one structure, there are nevertheless some advantages to be gained by maintaining independent electrical control of the diffraction region, by using separate electrodes for the injection of current into the device. The diffraction region may be an active semiconductor laser region, using such a separate electrode, or a common electrode with the arrays of waveguides, or the diffraction region may be a passive planar waveguide, with no electrodes.

The preferred form of the invention uses antiguides for the two arrays of waveguides, although positive-index waveguides could alternatively be employed. Another preference is to use one half of the first Talbot distance for the length of the diffraction region. Multiples of this length should also produce the same results.

In accordance with another important aspect of the invention, a practically uniform near-field intensity distribution is obtained from a laser array by utilizing a resonance condition that occurs in an array of antiguides structured to fall within or near a narrow range of parameters that favor the condition. More specifically, for a given operating wavelength, the width, interelement spacing, and refractive indices of the antiguides are selected to produce an operating point at or close to the resonance condition, in which there is coupling not just between adjacent waveguides, but between all of the waveguides, i.e. coupling from each waveguide element to all other elements in the array. With this complete or parallel coupling, device coherence is maximized and a practically uniform near-field distribution is obtained.

Briefly, and in general terms, a semiconductor laser array in accordance with this aspect of the invention comprises means for producing lasing action in the structure, and a set of negative-index waveguides with parallel longitudinal axes, having a lateral antiguide elemental width of $d_0$ and an interelement spacing s. The waveguides generate laterally traveling waves that have a wavelength $\lambda_0$, equal to approximately $2d_0$, in the antiguide elements and a wavelength $\lambda_1$ in the interelement regions. The interelement spacing s is selected to be approximately equal to an odd number of half-wavelengths, or $m\lambda_1/2$, where m is an odd integer, to produce a fundamental-array-mode resonance condition in which there is strong coupling between all elements of the array and a high degree of device coherence. The device also includes means within the array structure for suppressing operation in the out-of-phase array mode.

It will be further understood that the wavelength $\lambda_1$ of laterally traveling waves in the interelement regions is dependent on the difference $\Delta n$ between the (transverse) effective refractive index of the antiguide element and the (transverse) effective refractive index of the interelement region. In accordance with a further aspect of the the invention, this index difference and the spacing s are selected to provide an operating point close enough to the resonance condition to give strong coupling between all elements of the array, but to provide in addition strong discrimination between the fundamental mode and adjacent higher-order modes.

One approach to providing means for suppressing the out-of-phase mode in this structure is to include an interelement semiconductor structure for introducing interelement losses, which inhibit operation in the out-of-phase array mode. This may take the form of a transverse antiguiding structure that permits significant radiation loss to the substrate, or may include an absorbing layer providing absorption loss in the interelement regions.

The uniform near-field distribution provided by the resonance condition is a desirable attribute for almost any laser array, but it is also a desirable requirement for operation of an array in accordance with the first aspect of the invention, i.e. in conjunction with a diffraction region of length related to the Talbot distance. Therefore, an important embodiment of the invention is one in which the Talbot effect is utilized in conjunction with a spatial filter to eliminate undesirable array modes, and the arrays of the device are constructed as antiguides conforming to or closely approaching the defined resonance condition.

It will be appreciated from the foregoing that the present invention represents a significant advance in the field of semiconductor laser arrays. In particular, the invention permits operation at relatively high powers and drive currents without degradation of beam quality and in a selected mode, with high efficiency and device coherence. Other aspects and advantages of the invention will become apparent from the following more detailed description, taken in conjunction with the accompanying drawings.

BRIEF DESCRIPTION OF THE DRAWINGS

FIG. 3 is a simplified and fragmentary cross-sectional view of an antiguide array used in one preferred embodiment of the present invention;

FIG. 4 is a graph showing the variation of effective index of refraction laterally across the structure shown in FIG. 3;

FIG. 5 is a graph showing the variation of index of refraction transversely at a point midway between antiguide channels of the structure shown in FIG. 3;

FIG. 6 is a schematic representation of the optical field amplitude in a single antiguide;

FIG. 7a is a schematic representation similar to FIG. 6, but showing the optical field amplitude for an array of antiguides in a resonance condition;

FIG. 7b is a graph showing the lateral variation of effective index of refraction, corresponding to the representation of FIG. 7a;

FIG. 10 is a graph similar to FIG. 9, but showing the near-field intensity profile of the fundamental array mode at a point close to the resonance of the out-of-phase array mode;

FIG. 11 is a cross-sectional view similar to FIG. 3, but with the inclusion of a light-absorbing layer in the interelement regions, to favor operation in the in-phase array mode at or near resonance; and FIG. 12 is a graph similar to FIG. 5, showing the variation of effective index of refraction transversely at a point midway between antiguide channels of the structure shown in FIG. 11;

DESCRIPTION OF THE PREFERRED EMBODIMENTS

Figure 1:
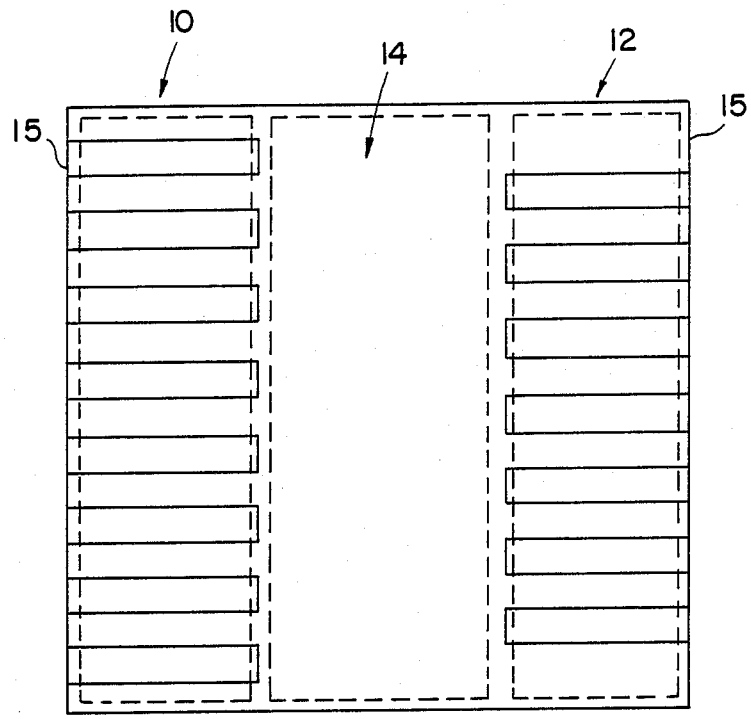
FIG. 1 is a simplified plan view of a semiconductor laser array in accordance with one aspect of the present invention, configured to favor operation in the in-phase array mode.

As shown in the drawings for purposes of illustration, the present invention is concerned with improvements in the field of semiconductor laser arrays. In particular, the invention has two major aspects. The first relates to the operation of a laser array at high power levels by utilizing the Talbot effect in combination with some means internal to the array structure, for suppressing out-of-phase array mode operation. The second relates to the improvement of operating characteristics provided when an array of antiguides is operated at a selected condition at or near a resonance point.

The Talbot effect is a diffraction phenomenon first observed in the nineteenth century. When a number of light emitters of the same intensity and wavelength are periodically spaced in an array and the emissions are transmitted into a diffraction medium, the diffracted light recombines into images of the emitters at a plane located at a predictable distance from the array, known as one Talbot length. The first Talbot length is given by $2d^2/\lambda$, where d is the periodic spacing of the light emitters and $\lambda$ is the wavelength of the emitted light in the diffraction medium. More generally, re-imaging takes place at other additional points spaced further from the emitters, and given by the expression $2nd^2/\lambda$, where n is an integer.

Investigators have discovered that an array of lasers can be operated with a high degree of mutual coherence by employing the Talbot effect. If a mirrored surface is placed at one-half the Talbot distance from the emitters, the diffracted light from the emitters is re-imaged back onto the emitters themselves. A difficulty of this configuration not first appreciated is that there is also re-imaging of the out-of-phase array mode, as well as the fundamental array mode. Accordingly, any device for improving coherence by means of the Talbot effect must also take account of the potential for operation in the out-of-phase array mode.

The embodiment of the invention shown in FIG. 1 includes a first array of semiconductor laser waveguides, indicated generally by reference numeral 10, and a second array of semiconductor laser waveguides 12. Each array has laser elements that are periodically spaced by a distance $d_0$, and the arrays are separated by a laterally unguided region 14 having a width approximately equal to one-half of the Talbot distance. In the configuration of FIG. 1, the elements of the array 10 are aligned with the interelement regions array 12, and this favors operation in the fundamental or in-phase array mode. The arrays 10 and 12 are cleaved at their ends remote from the diffraction region 14, to provide mirrored surfaces 15, and, as will be discussed, the cross-sections of the arrays are conventionally fabricated to provide either positive- or negative-index guiding of light.

If one considers that one of the arrays operates in the in-phase or fundamental array mode, emissions from this array will be transmitted through the diffraction region 14, and re-imaged at the midpoints of regions between the original emitting laser elements, i.e. at the centers of the waveguides in the other laser array. Emissions in the out-of-phase mode will be re-imaged at the same laterally spaced locations as the emitting array, i.e. at the midpoints of interelement regions in the opposite array, and will be effectively suppressed by a spatial filtering effect provided by the selected lateral positions of the two arrays.

Figure 2:
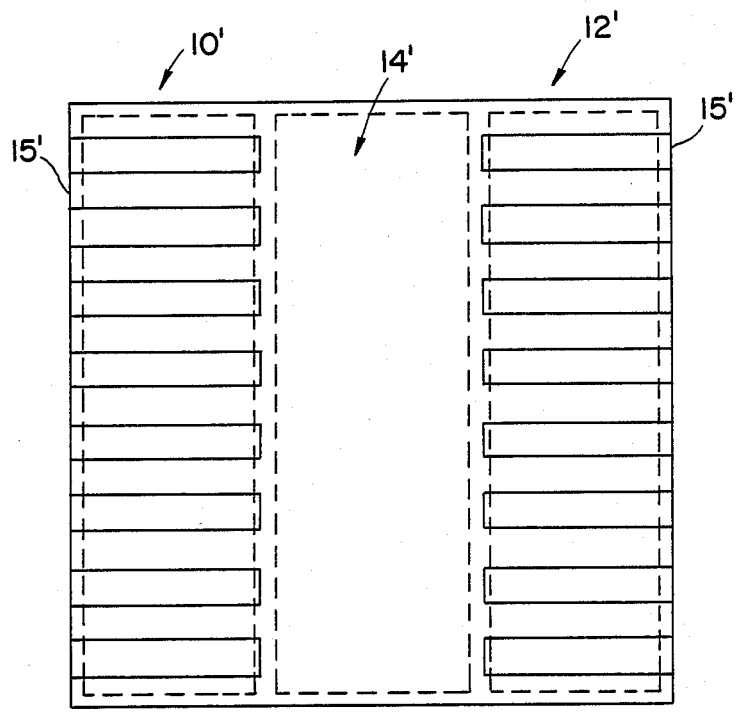
FIG. 2 is a simplified plan view similar to FIG. 1, but configured to favor operation in the out-of-phase array mode.

The device of FIG. 2 is identical with that of IG. except for the lateral alignment of the two arrays, referred to as 10' and 12' in FIG. 2. Here the two arrays are at least approximately aligned, and out-of-phase array mode emissions from one array are launched directly into the other array, since the out-of-phase radiation is re-imaged in its original form at one-half the Talbot distance. The in-phase mode is suppressed because of its being re-imaged in interelement regions in the FIG. 2 version of the invention. If the fundamental mode is desired from a device of this configuration, 180-degree phase shifters (not shown) may be employed external to or on the device, at positions corresponding to alternate elements. Alternatively, there may be some applications in which the out-of-phase mode is desirable.

The diffraction region 14 is, in general, any odd integral multiple of one-half of the Talbot distance. That is, the length of the region may be expressed generally as $(2n-1)d_0^2/\lambda$, where n is a positive integer.

FIG. 2 may also be considered to illustrate another variant form of the invention, in which the length of the diffraction region 14' is an even multiple of half of the Talbot distance, for example one full Talbot distance. In this case, both the fundamental and the out-of-phase array modes are re-imaged and some additional means must be provided, preferably internal to the structure of the device, to suppress the out-of-phase mode. This means may take various forms, some of which are described later in this specification.

The particular structure of the waveguides 10 and 12 is not critical to this aspect of the invention in its broadest sense. The waveguides may employ positive index guiding or negative index guiding. One presently preferred embodiment of the invention takes the form of arrays of antiguides, as shown by way of example in FIG. 3. The semiconductor array structure includes a substrate 16 of p+ type gallium arsenide (GaAs) on which is formed a layer 17 of p type aluminum gallium arsenide having 30% aluminum ($Al_{0.3}Ga_{0.7}As$) and a buffer layer 18 of n or p type aluminum gallium arsenide having 10% aluminum ($Al_{0.1}Ga_{0.9}As$). The lasing element is defined in part by channels 20 formed through the layers 17 and 18, and part-way into the substrate 16. Formed over the channel 20 and the buffer layer 18 is a first cladding layer 22 of p type aluminum gallium arsenide having thirty percent aluminum ($Al_{0.3}Ga_{0.7}As$). An active layer 24 of undoped GaAs is formed over the first cladding layer 22, and a second cladding layer 26 of n type $Al_{0.3}Ga_{0.7}As$ is formed over the active layer. The active layer 24 is undoped and the cladding layers 22 and 26 are appropriately doped to provide a diode action across the active layer is a p-n junction. The structure is capped with another layer of n+ type gallium arsenide and a metal layer for electrical contact, neither of which is shown. As is conventional, an additional contact layer (also not shown) is formed on the undersurface of the substrate 16.

As FIG. 4 shows, the effective index of refraction is lower in the regions of the channels 20 than in the interelement regions between channels. Therefore the channels 20 form an array of antiguides in a lateral sense. As disclosed in the second cross-referenced U.S. patent application, Ser. No. 07/180,415, now U.S. Pat. No. 4,860,298, such an array provides both strong mode confinement and strong interelement coupling. In the presently preferred embodiment of the invention, the arrays and 12 employ lateral antiguiding, although positive index guiding may be employed as an alternative.

In the preferred embodiment of the invention, the semiconductor materials are either aluminum gallium arsenide (AlGaAs) or indium gallium arsenide phosphide (InGaAsP), depending on the desired wavelength, but other semiconductor laser materials are also within the scope of the invention. The active material type includes quantum well, separately confined heterostructures, but again this is not critical to the invention. The fabrication method presently contemplated is metalorganic chemical vapor deposition (MOCVD), but liquid phase epitaxy (LPE), molecular beam epitaxy (MBE) and other chemical vapor deposition techniques may also be employed.

A principal advantage of the invention is that it provides increased power per unit solid angle, compared with similar structures not employing the diffraction region and the spatial filtering approach. In addition, arrays using these principles may be scaled up in width without decrease of power per unit solid angle. Another advantage is that the guided and unguided regions of the structure may be separately controlled by separate current electrodes, thereby permitting optimization of device performance by optimizing each region separately. One alternative is to design the diffraction region are a passive planar waveguide, with no electrodes. Still another advantage of the device is its improved discrimination against unwanted array modes.

The second principal aspect of the invention relates to the use of a resonant or nearly resonant condition in an array of antiguides, to achieve fundamental array mode operation at the highest possible power levels. In general, interelement coupling in linear arrays of semiconductor laser waveguides is limited to coupling between adjacent waveguides. This neighbor-to-neighbor coupling produces a characteristic cosine-shaped near-field intensity distribution pattern, and gives poor overall coherence across the device. For maximum device coherence all of the array elements should be equally coupled to each other, and for maximum efficiency the near-field intensity profile should be as near uniform as possible. Another requirement for maximum single-mode power is that the discrimination between the fundamental mode and the nearest higher-order mode should be maximized.

A single antiguide can be thought of as a generator of traveling waves in the lateral direction on each side of the waveguide. FIG. 6 shows a central antiguide core region of width $d_0$ and (transverse) effective refractive index $n_0$, surrounded by two cladding regions of higher (transverse) effective refractive index $n_1$. The leaked waves are traveling waves of a lateral propagation vector $h_1$ given by:

$$h_1 = \sqrt{(n_1 k)^2 - \beta^2},$$

where k is the free-space propagation constant and $\beta$ is the fundamental-mode propagation constant. It follows that the wavelength, in the lateral direction, for the leaky waves is:

$$\lambda_1 = \lambda / \sqrt{n_1^2 - n_{eff}^2},$$

where $n_{eff}$ is the (lateral) effective index of the fundamental mode and is equal to $\beta/k$.

In the antiguide core the lateral propagation vector is given by:

$$h_0 = \sqrt{(n_0 k)^2 - \beta^2},$$

which defines a lateral wavelength $\lambda_0$ as $$\lambda_0 = \lambda / \sqrt{n_0^2 - n_{eff}^2}.$$

When the index differential, $\Delta n = n_1 - n_2$, is greater than approximately $2 \times 10^{-2}$ and for core widths greater than about 2 $\mu$m (micrometers), the propagation vector $h_0$ for a single antiguide is very well approximated by $\pi/d_0$, which means that the wavelength within the antiguide element is given by $\lambda_0 \simeq 2d_0$. Therefore, for the fundamental mode of an unperturbed waveguide, the element width is basically one half of $\lambda_0$.

Constructive interference between standing waves from multiple antiguides occurs when the phase difference between codirectional waves leaked from successive antiguides is an integral number of $2\pi$. As illustrated in FIG. 7, if an array has period $\Lambda$, such that $\Lambda = d_0 + s$, where s is the element spacing, then as a leaked wave travels laterally across the array a distance $\Lambda$, its phase should change by an angle $2q\pi$, where q is an integer. At resonance, there is no destructive interference between leaked waves from separate channels, and therefore no energy reflected back into a waveguide. Each waveguide in the array can therefore be considered unperturbed.

The unperturbed element width d corresponds to a half wavelength and therefore a phase shift of. Accordingly, for resonance the interelement spacing s should make up for an odd number of half wavelengths in the spacing medium, i.e. a phase shift of $(2q-1)\pi$. Using the notation $m = 2q - 1$ and the expressions above for $\lambda_0$ and $\lambda_1$, the condition for resonance in the fundamental array mode is:

$$\Lambda = \lambda_0/2 + m\lambda_1/2$$
$$\approx d_0 + m\lambda/\{2\sqrt{n_1^2 - n_0^2 + (\lambda/2d_0)^2}\},$$
$$\text{for } m = 1, 3, 5, \ldots 2q - 1.$$

More simply, the resonance condition for the fundamental array mode is $s = m\lambda_1/2$ for odd values of m. FIG. 7 illustrates the resonance condition for the case $m = 3$, i.e. where are three half-wavelengths in each interelement spacing s, and there will be constructive interference between the leaked waves of any pair of waveguides. For even values of m, the out-of-phase array mode will exhibit a resonance condition. As inspection of FIG. 7 will show, if the distance s is, for example, four half-wavelengths, the traveling waves from two adjacent antiguides will be subject to destructive interference, i.e. an antiresonance condition will be obtained for the fundamental mode. For the out-of-phase array mode, however, an even number of half-wavelengths within each interelement space results in resonance for that mode.

Figure 9:
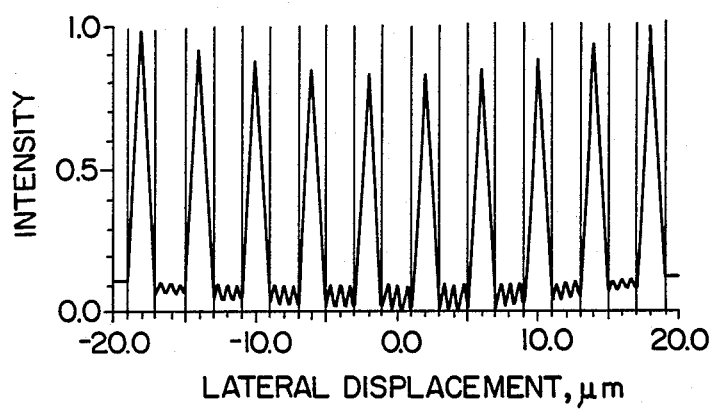
FIG. 9 is a graph showing the near-field intensity profile of light emitted from an array of antiguides in the resonant condition for the fundamental mode.

FIG. 9 shows the near-field intensity profile for an array of ten antiguides configured for the resonance condition of the fundamental mode. At resonance, the radiation loss from the antiguides is maximized and the intensity profile is substantially uniform across the array. Probably the greatest single benefit of this arrangement is that, at resonance, each element couples equally to all others in the array. Such strong coupling gives high coherence across the array, a large range of phase locking conditions, and a degree of intermodal discrimination that is relatively independent of the array element number. In addition, the uniform intensity profile matches a uniform injected current profile and maximizes the efficiency of the device. Moreover, the effects of spatial hole burning are minimized.

When the out-of-phase mode is resonated, using an even value of m, this corresponds roughly to an antiresonant condition for the fundamental mode, when codirectional leaky waves from adjacent waveguides are out of phase. The near-field intensity profile for this condition is shown by way of contrast in FIG. 10. Coupling is then reduced to a neighbor-to-neighbor relationship, and the profile degenerates to the cosine-like shape of evanescently coupled arrays.

Figure 8:
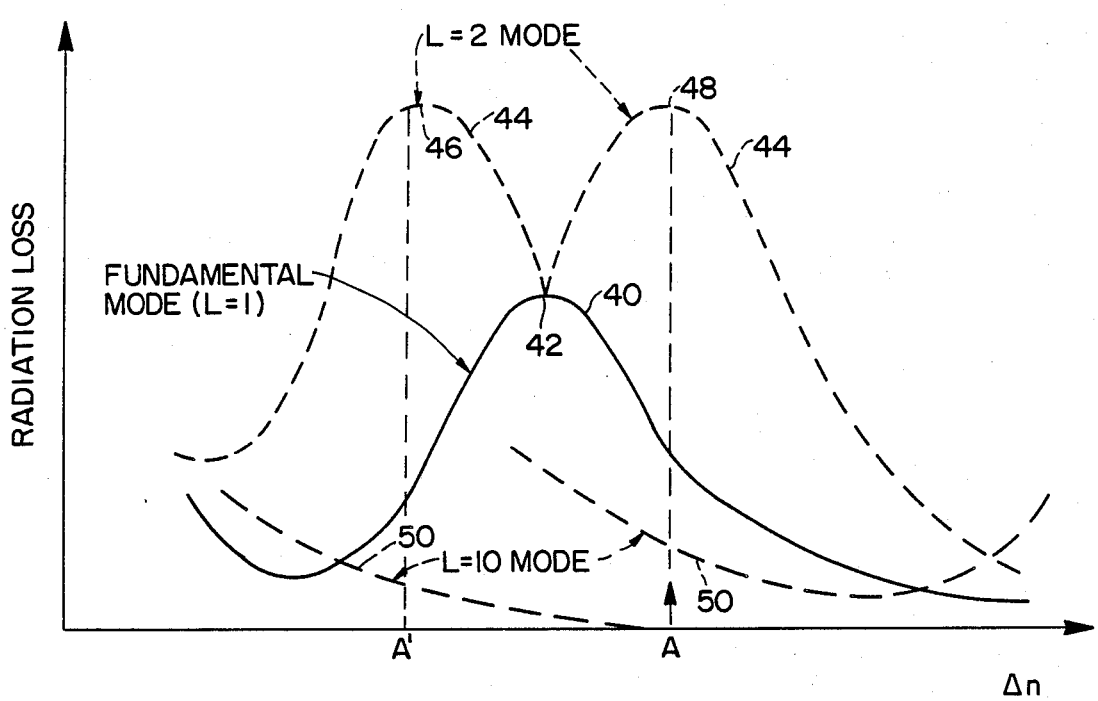
FIG. 8 is a set of graphs showing the variation of radiation loss, for various array modes, with respect to the difference in refractive index between antiguide channel regions and interelement regions of the structure, over a range encompassing a resonance condition in the fundamental array mode.

FIG. 8 shows the effect of operating the device of the invention at and near the fundamental-mode resonance point. The figure plots the overall radiation loss for various values of index differential $\Delta n$. As will be apparent from the resonance condition, for constant values of d and s the resonance condition is a function of the values of refractive index of the two materials involved. When the index differential is varied over a range of values close to the resonance condition, the overall radiation loss has a local peak at the resonance condition. The solid curve 40 shows the radiation loss for the fundamental mode, and the peak 42 represents the resonance condition for the fundamental mode of a ten-element array. It will be recalled that there are ten array modes for a ten element array. These are sometimes referred to as modes $L = 1$ (the fundamental), $L = 2$, and so forth up to $L = 10$ (the out-of-phase mode). The broken line 44 plots the radiation loss for the $L = 2$ mode, the closest of the higher-order modes to the fundamental mode. It will be noted that this mode has two local maxima 46 and 48 at positions spaced symmetrically on each side of the fundamental resonance. These peaks have index differential values indicated at $A'$ and $A$ on the index differential axis. The other broken line 50 indicates the radiation loss for the out-of-phase array mode ($L = 10$), which peaks at a higher value of $\Delta n$, out of the range plotted in the figure.

For operation solely in the fundamental array mode some means must be provided to eliminate or effectively suppress the unwanted modes of operation. The out-of-phase mode can be suppressed by any of a number of techniques about to be discussed. The only other array mode that is significant enough to pose a problem is the closest higher-order mode, $L = 2$. If the device of the invention were to be operated right at the fundamental mode resonance point 42, the $L = 2$ mode would present equal radiation loss and there would be difficulty discriminating between the two modes. However, operation at the point A provides still sufficient proximity to the resonance point to produce the desired advantages of resonance operation. Yet the difference in radiation losses of the fundamental and $L = 2$ mode at that point are virtually maximized, making it easier to discriminate between the two modes.

The out-of-phase array mode may be suppressed by means of a wide-waveguide coupling region, as disclosed and claimed in the first of the cross-referenced patent applications, Ser. No. 06/921,648, now U.S. Pat. No. 4,852,113. A second alternative to suppressing the out-of-phase array mode is to employ the Talbot-effect configuration discussed earlier in this specification. Specifically, the device configuration described with reference to FIG. 1 can be constructed to employ waveguide arrays 10 and 12 of the antiguide type, and with a geometry selected to operate at the fundamental-mode resonance condition. The combination is an ideal one, since the resonance condition produces a near-uniform near-field intensity profile, and this enhances the Talbot effect. Moreover, the Talbot-effect device of the invention provides an effective technique for suppressing the out-of-phase mode in the device.

A third alternative for suppressing the out-of-phase mode resides in a specific configuration of the antiguide array illustrated in FIG. 3. It will be noted from FIG. 9 that, in the fundamental mode at or near resonance, the interelement intensity field is practically negligible. However, at a point remote from the resonance of the fundamental mode, and close to resonance of the out-of-phase array mode, the fundamental mode has significant field intensity between antiguide elements, as shown in FIG. 10. Similarly, near the fundamental-mode resonance point, the out-of-phase mode has significant field intensity between elements. Therefore, the out-of-phase array mode can be effectively suppressed if sufficient interelement loss is introduced into the structure. There are two alternative embodiments of this aspect of the invention. In one, the cross-section of FIG. 3 is structured to introduce radiation loss between the elements, and in the other (shown in FIG. 11) an absorption loss is introduced between the elements.

To introduce a sufficient radiation loss to the substrate 16, the lower cladding layer 17 must be relatively thin. The entire region between elements operates as a transverse waveguide, and if there is radiation loss to the substrate the structure is operating as a transverse antiguide. As indicated at 60 in FIG. 3, which shows the intensity variation across a transverse cross section of the interelement region, a significant amount of radiation is lost to the substrate. This loss reduces the interelement intensity required for out-of-phase mode operation (FIG. 10) and effectively suppresses this mode.

Two examples of the dimensions required to achieve these interelement radiation losses are:

| Example 1: | | |
|---|---|---|
| Active layer thickness | $d_a =$ | 900Å |
| Layer 22 thickness | $t =$ | 0.1 μm |
| Layer 18 thickness | $d_w =$ | 0.4 μm |
| Layer 17 thickness | $d_c =$ | 0.4 μm |
| Example 2: | | |
| Active layer thickness | $d_a =$ | 900Å |
| Layer 22 thickness | $t =$ | 0.2 μm |
| Layer 18 thickness | $d_w =$ | 0.44 μm |
| Layer 17 thickness | $d_c =$ | 0.4 μm |
| The ranges over which significant interelement radiation loss is introduced appear to be as follows: | | |
| Active layer thickness | $d_a =$ | 800–1,000Å |
| Layer 22 thickness | $t =$ | 0.05–0.2 μm |
| Layer 18 thickness | $d_w =$ | 0.35–0.5 μm |
| Layer 17 thickness | $d_c \leq$ | 0.4 μm |

Of these dimensions, the most critical appears to be the thickness $d_c$, which, if less than or equal to 0.4 μm, introduces the necessary interelement losses to suppress the out-of-phase array mode. The alternative illustrated in FIG. 11 includes a light absorbing layer 62 of gallium arsenide between the layers 18 and 22. The thickness of the light-absorbing layer 62 can, for example be in the range 0.1–0.2 μm. The absorbing loss has the same effect as the radiation loss, reducing the magnitude of the interelement field intensity and thereby suppressing operation in the out-of-phase array mode.

In summary, the present invention has two related aspects. One is the use of an unguided diffraction region between two arrays of waveguides, which may be selected to have a spatial filtering effect to favor a desired array mode. This provides a laser array with increased power per unit solid angle, and with additional advantages of ability to scale the device up to larger arrays, ability to control the electrical excitation of the device for better optimization, and improved modal discrimination. The second aspect of the invention is the use of a resonance condition in an antiguide array, to produce a uniform near-field intensity pattern and improved coupling and device coherence. This aspect may be combined with the first to suppress the out-of-phase mode, or the out-of-phase mode may be suppressed by other means, such as by introducing interelement radiation losses or absorption losses in the antiguide array.

It will also be appreciated that, although several embodiments of the invention have been described in detail for purposes of illustration, various modifications may be made without departing from the spirit and scope of the invention. Accordingly, the invention is not to be limited except as by the appended claims.

We claim:

1. A semiconductor laser array structure, comprising:
    means for producing lasing action in the structure, including at least one substrate, an active semiconductor layer and surrounding cladding layers successively formed on the substrate, electrodes later formed on opposite faces of the substrate, for applying a voltage across the active layer, and a pair of reflective facets, at least one of which is an emitting facet, still later formed at opposite ends of the array structure;
    a first set of waveguides with parallel longitudinal axes;
    a second set of waveguides with parallel longitudinal axes;
    a laterally unguided diffraction region located between the first and second sets of waveguides, the diffraction region having a length approximately equal to a multiple of one half of the Talbot distance, given by the quantity $nd^2/\lambda$, where n is a positive integer, d is the lateral periodic spacing of the waveguides in the first and second sets of waveguides, and $\lambda$ is the wavelength of light, in the diffraction region, produced by the lasing action of the device; and
    means internal to the structure, for suppressing unwanted array modes of operation.

2. A semiconductor laser array structure as defined in claim 1, wherein:
    the length of the diffraction region is an odd multiple of half of the Talbot distance; and
    the means for suppressing unwanted array modes are inherent in the locations of the first and second sets of waveguides, the longitudinal axes of waveguides in the first set being aligned with the longitudinal axes of the waveguides in the second set in such a manner as to favor a selected array mode.

3. A semiconductor laser array structure as defined in claim 2, wherein:
    the longitudinal axes of the waveguides in the first set are approximately aligned with interelement regions of the waveguides in the second set to favor the 0°-phase-shift array mode and to suppress the 180°-phase-shift array mode.

4. A semiconductor laser array structure as defined in claim 2, wherein:
    the longitudinal axes of the waveguides in the first set are approximately aligned with the longitudinal axes of the waveguides in the second set to favor the 180°-phase-shift array mode and to suppress the 0°-phase-shift array mode.

5. A semiconductor laser array structure as defined in claim 1, wherein:
    the length of the diffraction region is an even multiple of half of the Talbot distance; and
    the means for suppressing unwanted array modes includes a structure internal to at least one of the first and second sets of waveguides.

6. A semiconductor laser array structure as defined in claim 5, wherein:
    the first and second sets of waveguides are antiguides; and the structure internal to at least one of the first and second sets of waveguides includes means for introducing interelement losses tending to suppress the 180°-phase-shift array mode.

7. A semiconductor laser array structure as defined in claim 1, wherein:
the diffraction region is of a semiconductor material and the entire device is integrated into a monolithic structure.

8. A semiconductor laser array structure as defined in claim 1, wherein:
the first and second sets of waveguides are antiguides.

9. A semiconductor laser array structure as defined in claim 1, wherein:
the diffraction region is a passive planar waveguide.

10. A monolithic semiconductor laser array structure, comprising:
means for producing lasing action in the structure, including a substrate, an active semiconductor layer and surrounding cladding layers successively formed on the substrate, electrodes later former on opposite faces of the substrate, for applying a voltage across the active layer, and a pair of reflective facets, at least one of which is an emitting facet, still later formed at opposite ends of the array structure;
a first set of waveguides with parallel longitudinal axes;
a second set of waveguides with parallel longitudinal axes; and
a laterally unguided semiconductor diffraction region located between the first and second sets of waveguides, the diffraction region having a length approximately equal to an odd-numbered multiple of one half of the Talbot distance, given by the quantity $(2n-1)(d^2/\lambda)$, where n is a positive integer, d is the lateral periodic spacing of the waveguides in the first and second sets of waveguides, and $\lambda$ is the wavelength of light, in the diffraction region, produced by the lasing action of the device;
and wherein the longitudinal axes of waveguides in the first set are approximately aligned with interelement regions of the waveguides in the second set, to favor the 0°-phase-shift array mode and to suppress the 180°-phase-shift array mode.

11. A. monolithic semiconductor laser array structure as defined in claim 10, wherein:
the first and second sets of waveguides are antiguides.

12. A monolithic semiconductor laser array structure as defined in claim 10, wherein:
the electrodes for applying a voltage across the active layer include a separate electrode for independent control of current applied to the diffraction region.

13. A monolithic semiconductor laser array structure as defined in claim 10, wherein:
the length of the diffraction region is approximately equal to $(d^2/\lambda)$, or half of the first Talbot length.

14. A semiconductor laser array structure, comprising:
means for producing lasing action in the structure, including at least one substrate, an active semiconductor layer and surrounding cladding layers successively formed on the substrate, electrodes later formed on opposite faces of the substrate, for applying a voltage across the active layer, and a pair of reflective facets, at least one of which is an emitting facet, still later formed at opposite ends of the array structure;
a first set of waveguides with parallel longitudinal axes;
a second set of waveguides with parallel longitudinal axes;
a laterally unguided diffraction region located between the first and second sets of waveguides, the different region having a length selected such that light from one set of waveguides is re-imaged into the other set of waveguides, the length being a function of the lateral periodic spacing of the waveguides and the wavelength of light, in the diffraction region, produced by the lasing action of the device; and
means internal to the device, for suppressing unwanted array modes of operation, wherein the longitudinal axes of the waveguides in the first set are approximately aligned with interelement regions of the waveguides in the second set, to favor the 0°-phase-shift array mode and to suppress the 180°-phase-shift array mode.

15. A semiconductor laser array structure, comprising:
means for producing lasing action is the structure, including a substrate, an active semiconductor layer and surrounding cladding layers successively formed on the substrate, electrodes later formed on opposite faces of the substrate, for applying a voltage across the active layer, and a pair of reflective facets, at least one of which is an emitting facet, still later formed at opposite ends of the array structure;
a set of negative-index waveguides with parallel longitudinal axes, each waveguide having an antiguide core defining a waveguide element, and a laterally surrounding cladding material forming interelement regions, the waveguides having a lateral antiguide elemental width of $d_0$ and an interelement spacing s;
wherein the waveguides, considered separately, generate laterally traveling waves that have a wavelength $\lambda_0$, equal to approximately $2d_0$, in the antiguide core and a waveguide $\lambda_1$ in the antiguide cladding material;
and wherein the interelement spacing s is selected to be approximately equal to an odd number of half-wavelengths, or $m\lambda_1/2$, where m is an odd integer, to produce a 0°-phase-shift-array-mode resonance condition in which there is strong coupling between all elements of the array and a high degree of device coherence.

16. A semiconductor laser array structure as defined in claim 15, and further comprising:
means within the array structure for suppressing operation in the 180°-phase-shift array mode.

17. A semiconductor laser array structure as defined in claim 16, wherein:
the wavelength $\lambda_1$ of laterally traveling waves in the interelement regions is dependent on the difference in between the refractive index of the antiguide element and the refractive index of the interelement region; and
the values of $\Delta n$ and s are selected to provide an operating point close enough to the resonance condition to provide strong coupling between all elements of the array, but to provide in addition strong discrimination between the 0°-phase-shift mode and adjacent higher-order modes.

18. A semiconductor laser array structure as defined in claim 17, wherein the means for suppressing the 180°-phase-shift array mode includes:
an interelement semiconductor structure for introducing interelement losses, which inhibit operation in the 180°-phase-shift array mode.

19. A semiconductor laser array structure as defined in claim 18, wherein the structure for introducing interelement losses includes a transverse antiguiding structure that permits significant radiation loss to the substrate.

20. A semiconductor laser array structure as defined in claim 18, wherein the structure for introducing interelement losses includes an absorbing layer providing absorption loss in the interelement regions.

21. A monolithic semiconductor laser array structure, comprising:
means for producing lasing action in the structure, including a substrate, an active semiconductor layer and surrounding cladding layers successively formed on the substrate, electrodes later formed on opposite faces of the substrate, for applying a voltage across the active layer, and a pair of reflective facets, at least one of which is an emitting facet, still later formed at opposite ends of the array structure;
a first set of waveguides with parallel longitudinal axes;
a second set of waveguides with parallel longitudinal axes; and
a laterally unguided semiconductor diffraction region located between the first and second sets of waveguides, the diffraction region having a length approximately equal to an odd-numbered multiple of one half of the Talbot distance, given by the quantity $(2n-1)(d^2/\lambda)$, where n is a positive integer, d is the lateral periodic spacing of the waveguides in the first and second sets of waveguides, and $\lambda$ is the wavelength of light, in the diffraction region, produced by the lasing action of the device;
wherein the longitudinal axes of waveguides in the first set are approximately aligned with interelement regions of the waveguides in the second set, to favor the 0°-phase-shift array mode and to suppress the 180°-phase-shift array mode;
wherein the first and second sets of waveguides are negative-index waveguides, each waveguide having an antiguide core defining a waveguide element, and a laterally surrounding cladding material forming interelement regions, the waveguides having a lateral antiguide elemental width of $d_0$ and an interelement spacing s;
wherein the waveguides, considered separately, generate laterally traveling waves that have a wavelength $\lambda_0$, equal to approximately $2d_0$, in the antiguide core and a wavelength $\lambda_1$ in the antiguide guide cladding material;
and wherein the interelement spacing s is selected to be approximately equal to an odd number of half-wavelengths, or $m\lambda_1/2$, where m is an odd integer, to produce a 0°-phase-shift-array-mode resonance condition in which there is strong coupling between all elements of the array and a high degree of device coherence.

22. A monolithic semiconductor laser array structure as defined in claim 20, wherein:
the wavelength $\lambda_1$ of laterally traveling waves in the interelement regions is dependent on the difference $\Delta n$ between the refractive index of the antiguide element and the refractive index of the interelement region; and
the values of $\Delta n$ and s are selected to provide an operating point close enough to the resonance condition to provide strong coupling between all elements of the array, but to provide in addition strong discrimination between the 0°-phase-shift mode and adjacent higher-order modes.

* * * * *